United States Patent

Doughty et al.

[11] Patent Number: 5,851,063
[45] Date of Patent: *Dec. 22, 1998

[54] LIGHT-EMITTING DIODE WHITE LIGHT SOURCE

[75] Inventors: Douglas Allen Doughty, Charlton; Anil Raj Duggal; Yung Sheng Liu, both of Niskayuna, all of N.Y.

[73] Assignee: General Electric Company, Schenectady, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 736,843

[22] Filed: Oct. 28, 1996

[51] Int. Cl.$^6$ .................................................. F21V 9/00
[52] U.S. Cl. .................................... 362/231; 362/800
[58] Field of Search ...................... 362/800, 231

[56] References Cited

U.S. PATENT DOCUMENTS

| | | | |
|---|---|---|---|
| 5,255,171 | 10/1993 | Clark | 362/800 |
| 5,477,436 | 12/1995 | Bertling et al. | 362/800 |
| 5,585,783 | 12/1996 | Hall | 362/800 |
| 5,612,811 | 3/1997 | Aikawa et al. | 362/800 |

OTHER PUBLICATIONS

"Optimum Phosphor Blends for Fluorescent Lamps," W. Walter, Applied Optics, vol. 10, No. 5, May 1971, pp. 1108–1113.

"Luminosity and Color–Rendering Capability of White Light," W.A. Thornton, Journal of the Optical Society of America 61, pp. 1155–1163 (1971).

*Primary Examiner*—Carroll B. Dority
*Attorney, Agent, or Firm*—Jill M. Breedlove; Douglas E. Stoner

[57] ABSTRACT

A system of at least three multi-colored LED's has an optimized color rendering index by proper selection of the wavelengths of each LED, such system being useful for general illumination purposes.

11 Claims, 3 Drawing Sheets

LIGHT-EMITTING DIODE WHITE LIGHT SOURCE

FIELD OF INVENTION

The present invention relates generally to light-emitting diodes and, more particularly, to using light-emitting diodes as a white light source for general illumination purposes.

BACKGROUND OF THE INVENTION

Significant advances have been made in the technology of light-emitting diodes (LED's) since their invention in the 1960's. In the 1980's, red-emitting AlGaAs LED's were developed with external quantum efficiencies greater than 10%, such devices actually being more energy efficient and longer lasting producers of red light than red-filtered incandescent bulbs. For this reason, they are now cost-effective replacements for standard incandescent light sources in various applications such as automotive brake lights. More recently, high-efficiency light-emitting diodes have been developed and are commercially available in the blue and blue-green wavelength range based on the InGaN and AlGaN material systems. External quantum efficiencies of 5.4% in the blue and 2.1% in the blue-green have been demonstrated with these materials. This same material system has more recently been extended into the green and yellow color range with an external quantum efficiency greater than 1%. Alternative material systems based on ZnSe or II–VI compounds have been demonstrated to yield comparable efficiencies in the green to blue wavelength range.

White-light LED systems are commercially available, but they are not competitive with standard white-light sources in either performance or cost. Accordingly, it is desirable to provide an LED system that is competitive with traditional light sources for general illumination purposes.

SUMMARY OF THE INVENTION

A system of at least three multi-colored LED's has an optimized color rendering index ($R_a$) by proper selection of the wavelengths of each LED. In a system with at least three LED's, $R_a>80$ can be achieved; and in a system with at least four LED's, $R_a>85$ can be achieved. Such systems are useful for general illumination purposes.

BRIEF DESCRIPTION OF THE DRAWINGS

The features and advantages of the present invention will become apparent from the following detailed description of the invention when read with the accompanying drawings in which.

DETAIED DESCRIPTION OF THE INVENTION

Figure 1:
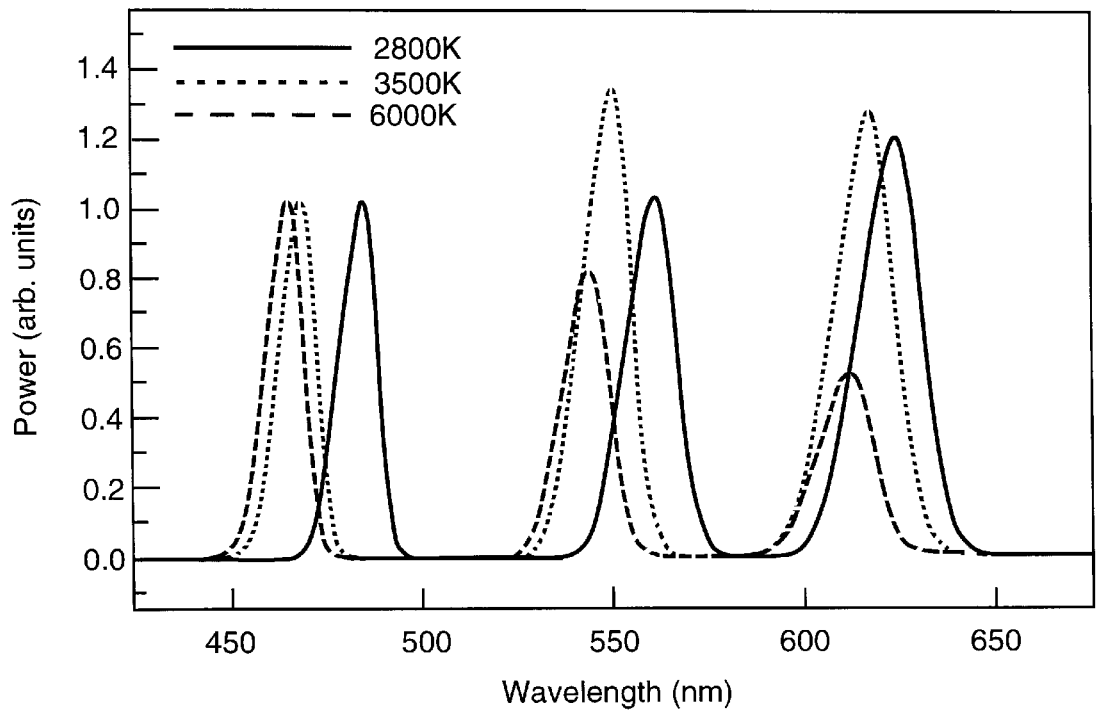
FIG. 1 graphically represents relative spectral power distribution versus wavelength for each model system for the three-LED systems set forth in Table II.

For general illumination purposes, the critical performance parameters for a light source are its color, its efficiency in providing light detectable by the human eye, and the way in which colors illuminated by the light source look to the human eye. These three parameters are described quantitatively by the chromaticity, efficacy, and color rendition index ($R_a$), respectively. In accordance with the present invention, a color model for combinations of two or more LED's has been developed and used to determine values for chromaticity, efficacy, and color rendition index ($R_a$).

The first step in defining an LED system is to specify the desired chromaticity of the system. The chromaticity of a light source is determined by integrating the source spectrum weighted with the spectral tristimulus functions as follows:

$$X=\int S(\lambda)\bar{x}(\lambda)d\lambda, \quad Y=\int S(\lambda)\bar{y}(\lambda)d\lambda, \quad Z=17\int S(\lambda)\bar{z}(\lambda)d\lambda, \tag{1}$$

where X, Y, and Z are the tristimulus values (i.e., the magnitudes of the three imaginary primary colors in the 1931 CIE (Commission Internationale de l'Eclairage) system, $S(\lambda)$ is the source spectral power distribution (power per unit wavelength), and $\bar{x}$, $\bar{y}$, and $\bar{z}$ are the spectral tristimulus functions. The integrations are carried out over a wavelength interval from 380 to 770 nm. The chromaticity coordinates are then given by $$x = \frac{X}{X+Y+Z}, \tag{2}$$

$$y = \frac{Y}{X+Y+Z}.$$

It is usually desirable that an illumination source have a chromaticity near the locus of points in chromaticity space that correspond to blackbody sources. In this model, three systems have been considered, two corresponding to blackbody sources at 2800K and 3500K, and a daylight source at 6000K. (The chromaticity of daylight is slightly different from that for a black body.) Table I lists the three systems with their corresponding chromaticity coordinates.

TABLE I

| System | Color Temperature | (x,y) coordinates |
|---|---|---|
| LED-1 | 2800 | 0.452, 0.409 |
| LED-2 | 3500 | 0.405, 0.391 |
| LED-3 | 6000 | 0.322, 0.338 |

Color mixing is an additive process, so that given $S_i(\lambda)$ for each of n LED's, the X tristimulus value of the system is given by $$X_T = \sum_{i=1}^{n} X_i, \tag{3}$$

Values for $Y_T$ and $Z_T$ are determined in similar manner. Let $S_i(\lambda)=A_i f_i(\lambda)$, where $A_i$ is the amplitude of each LED and $f_i(\lambda)$ is the LED lineshape function. Using this expression and Equations (1), (2), and (3), the chromaticity coordinates for the system can be derived and are given by $$x_T = \frac{\sum_{i=1}^{n} x_i A_i F_i / y_i}{\sum_{i=1}^{n} (X_i + Y_i + Z_i)}, \tag{4}$$

-continued $$y_T = \frac{\sum_{i=1}^{n} A_i F_i}{\sum_{i=1}^{n} (X_i + Y_i + Z_i)},$$

where $F_i$ is the integral of $f_i(\lambda)$ weighted with $\bar{y}$.

The amplitude of each LED can be determined by solving Equation (4) for $A_i$. If it is possible to attain the desired chromaticity coordinates with the given LED's, then at least one solution to equation (4) will exist. For $n \leq 3$, this solution provides a unique determination of the relative amplitudes required for the individual LED's. For $n>3$, however, Equation (4) is underdetermined so that, in general, more than one solution for the relative amplitudes exists.

In this model, $f_i(\lambda)$ is a Gaussian function for each LED. The spectral distributions of actual LED's show that the core of the lineshape is well-approximated by a Gaussian, but the "wings" tend to be more intense than a Gaussian; in addition, there tends to be some asymmetry in the actual spectral distribution with more intensity on the longer wavelength side of the peak. Since most of the power per unit wavelength is contained in the core of the lineshape, the use of a Gaussian will provide a good approximation to an actual LED system. The spectral linewidth of the LED is not an independent parameter. In energy space the spectral width is only dependent on the device temperature, so that in wavelength space the width is proportional to the square the peak wavelength. The linewidth used in these calculations was determined from commercial LED spectra and was found to be ~0.06 eV at 25° C.

The two critical figures of merit for an LED white-light system are the efficacy and the general color rendering index. The efficacy is the photometric analog of the radiometric efficiency; i.e., the efficiency is the ratio of the visible power produced to the input electrical power, whereas the efficacy is the ratio of the integral of the visible power per unit wavelength weighted by the photopic eye response to the input electrical power. The efficacy for an LED system can be expressed as:

$$\epsilon = K \bar{f} y(\lambda) \left( \sum_{i=1}^{n} \frac{S_i(\lambda) \eta_i}{\int S_i(\lambda) d\lambda} \right) d\lambda, \quad (5)$$

where K=683 lumens per visible watt and $\eta_i$ is the external quantum efficiency of the ith LED, $\bar{y}$ being the normalized photopic eye response function. A typical 100 Watt incandescent lamp has an efficacy of 18 lumens/Watt while a typical 40 Watt "cool white" fluorescent lamp has an efficacy of 72 lumens/Watt.

The color rendering index is a quantitative measure of how different an object will appear when illuminated by a particular source as compared to a standard source. There are fourteen test objects specified by the CIE that are used in the calculation of color rendering. The specification of each test object is given by a reflectance function, i.e., the fractional reflected power per unit wavelength. Briefly, the calculation consists of determining the tristimulus values of the test objects when illuminated by the source of interest and by a standard source. Each tristimulus value is given by the integral of the source spectral power distribution weighted by the tristimulus function and the reflectance function. A color difference between two points in chromaticity space is defined, and is used to calculate the color difference between a given test object when illuminated by the source of interest and the same test object illuminated by the standard source. This yields fourteen special color rendering indices. The general color rendering index $R_a$ is the arithmetic average of the eight of these indices. The scale is set such that a blackbody source will have an $R_a$ of 100 and a 3000K "warm white" fluorescent lamp will give an $R_a$ of 50. Since a blackbody is used as the standard source for color temperatures less than 5000K, $R_a \cong 100$ for an incandescent lamp.

In accordance with the present invention, systems of at least three LED's have been optimized for high color rendering capability in a manner heretofore unknown such that such three-LED systems are suitable for general illumination purposes. In a preferred embodiment, the selected wavelength for a first of the three light-emitting diodes is in a range from approximately 530 to approximately 570 nm, the selected wavelength for a second of the three light-emitting diodes is in a range from approximately 455 to approximately 490 nm, and the selected wavelength for a third of the three light-emitting diodes is in a range from approximately 605 to approximately 630 nm.

Table II lists wavelengths that maximize $R_a$ for a three-color system at three preselected chromaticity points. Advantageously, $R_a > 80$ for these systems, comparable to good color-rendering fluorescent lamps.

TABLE II

| Color Temperature (K) | $\lambda_1$ (nm) | $\lambda_2$ (nm) | $\lambda_2$ (nm) | $R_a$ | Efficacy (lumens/Watt) |
|---|---|---|---|---|---|
| 2800 | 482 | 559 | 621 | 86.3 | 35.2 |
| 3500 | 466 | 547 | 614 | 84.1 | 39.0 |
| 6000 | 463 | 542 | 610 | 83.0 | 35.8 |

The efficacies listed in Table II are obtained for the wavelengths that maximize $R_a$ while assuming $\eta_i$=0.1 for each LED, efficacy being a function of $\eta_i$. The amplitude for each LED needed to yield the chromaticities in Table I are shown in FIG. 1 which is a graph of relative spectral power distribution versus wavelength for each model system.

Figure 2:
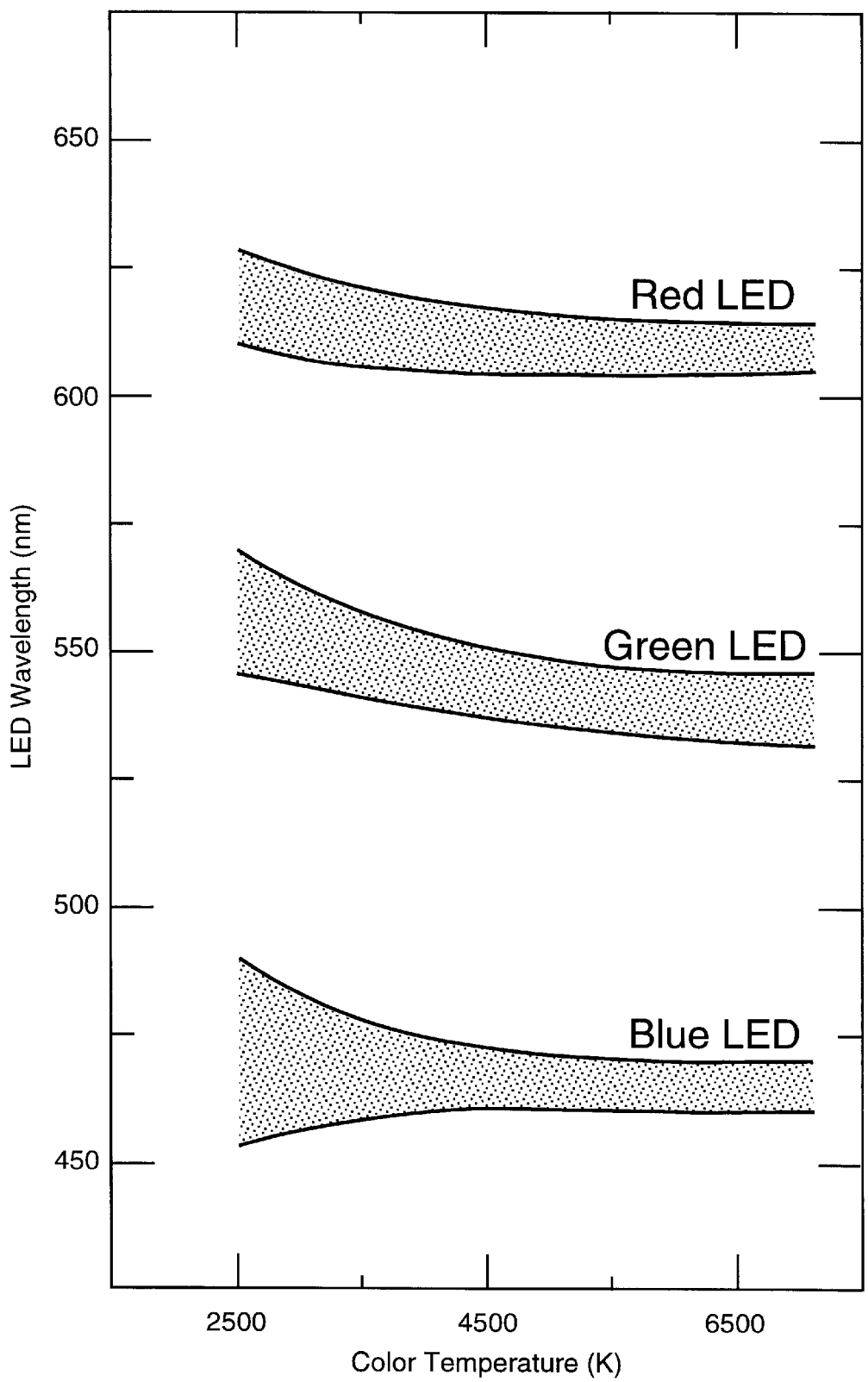
FIG. 2 graphically represents how the wavelengths that maximize the color rendering index ($R_a$) vary as a function of blackbody temperature.

FIG. 2 graphically illustrates how the wavelengths that maximize $R_a$ for a three-LED system vary as a function of blackbody temperature. LED's chosen from each of the cross-hatched regions will result in an $R_a > 80$. In general, a particular application requires a particular chromaticity. In accordance with the present invention, FIG. 2 is used to select the wavelengths of the LED's that provide the highest available color rendering for that temperature. Similar curves can be generated for chromaticities off the blackbody locus, but such sources are less desirable for general lighting applications.

Figure 3:
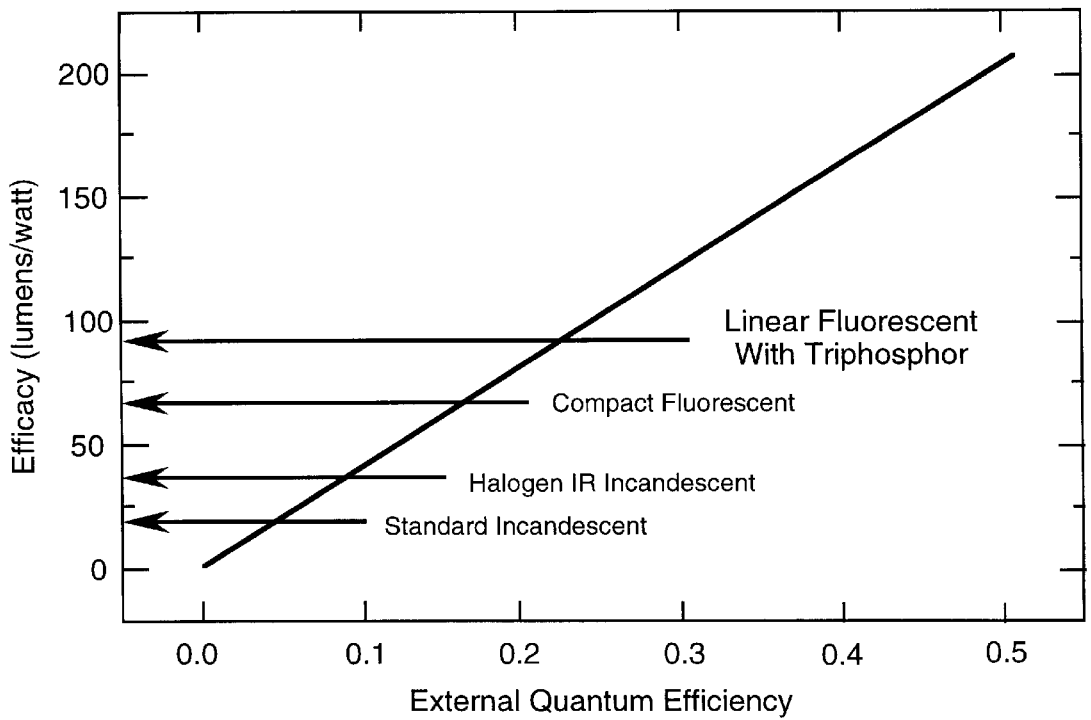
FIG. 3 graphically represents efficacy of a three-LED system as a function of quantum efficiency of the LED's.

FIG. 3 is a plot of how the efficacy of the 3500K three-LED case in Table II extrapolates as the external quantum efficiencies for the LED's increase (assuming $\eta_i$ is the same for all three LED's). Shown for comparison are the efficacies for some current technology lighting sources with which white-light LED systems might compete.

An enhanced color rendering system may be achieved with four LED's. In a preferred embodiment, the selected wavelength for a first of the four light-emitting diodes is in a range from approximately 440 to approximately 450 nm, the selected wavelength for a second of the four light-emitting diodes is in a range from approximately 455 to approximately 505 nm, the selected wavelength for a third of the four light-emitting diodes is in a range from approximately 555 to approximately 565 nm, and the selected wavelength for the fourth light-emitting diode is in a range from approximately 610 to approximately 620 nm.

Table III lists four wavelengths that have been determined to yield incandescent-like values of $R_a$.

TABLE III

| λ₁ (nm) | λ₂ (nm) | λ₃ (nm) | λ₄ (nm) | R_a | Efficacy (lumens/Watt) |
|---|---|---|---|---|---|
| 445 | 500 | 557 | 615 | 96.0 | 31.3 |

Figure 4:
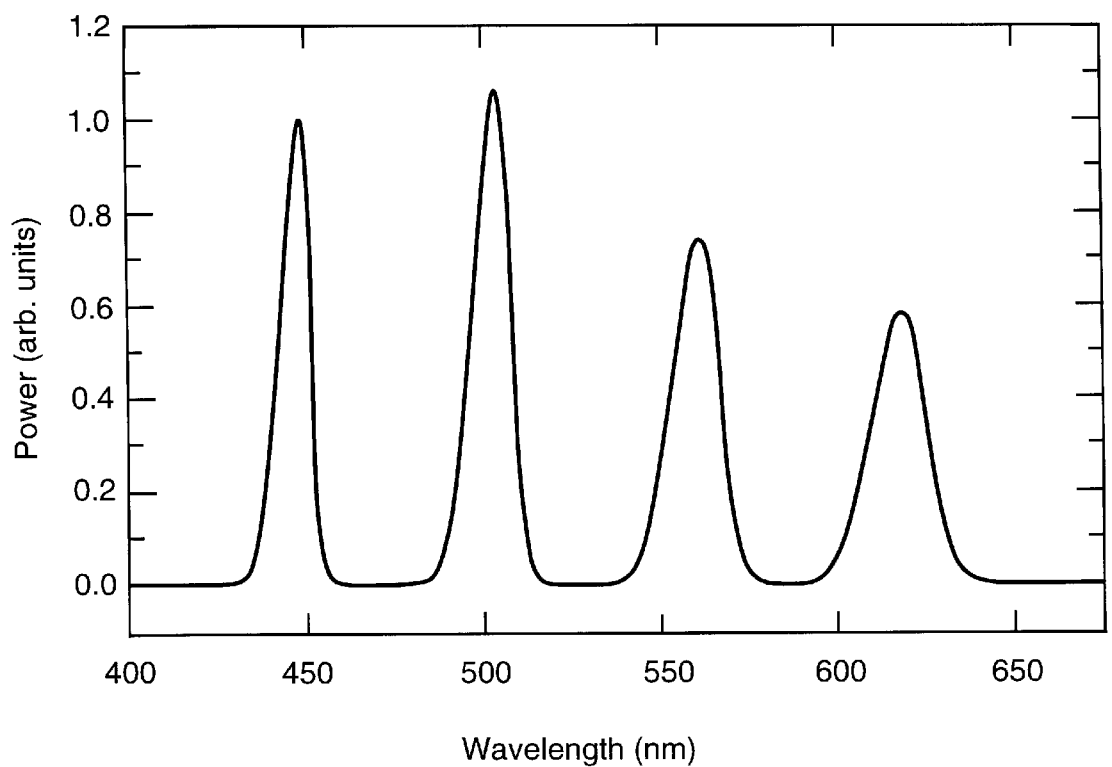
FIG. 4 graphically represents the spectral power distribution of a four-LED system at 6000K.

FIG. 4 graphically illustrates the relative intensity of the four-LED system specified in Table III. Not only is $R_a$ quite high, but all except one of the special color rendering indices are in excess of 90. When compared with the results in Table II for a three-LED system, $R_a$ is increased by 16% and the efficacy is decreased by 13%. (Efficacy will generally decrease when $R_a$ increases since the spectral power is distributed over a broader wavelength range). Because of the significantly increased computational time associated with searching for the maximum $R_a$ in five-dimensional space (four wavelengths and one additional amplitude), only a fraction of parameter space was considered. Thus, the results in Table III do not necessarily represent the global maximum for $R_a$. Advantageously, however, these results clearly demonstrate that exceptional color rendering is possible with an LED system.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A general illumination system, comprising:
   at least three light-emitting diodes, each light-emitting diode providing visible light at a preselected wavelength for optimizing color rendition index for the system for general illumination applications, each preselected wavelength being defined by a predetermined chromaticity and a maximized color rendition index at the predetermined chromaticity, the predetermined chromaticity being proximate the locus of points in chromaticity space corresponding to blackbody sources.

2. The system of claim 1, comprising three light-emitting diodes, the wavelength for each light-emitting diode being selected such that the color rendition index for the system is at least approximately 80.

3. The system of claim 2 wherein the selected wavelength for a first of the three light-emitting diodes is in a range from approximately 530 to approximately 570 nm, the selected wavelength for a second of the three light-emitting diodes is in a range from approximately 455 to approximately 490 nm, and the selected wavelength for a third of the three light-emitting diodes is in a range from approximately 605 to approximately 630 nm.

4. The system of claim 1, comprising at least four light-emitting diodes, the wavelength for each light-emitting diode being selected such that the color rendition index for the system is at least approximately 85.

5. The system of claim 4 wherein the selected wavelength for a first of the light-emitting diodes is in a range from approximately 440 to approximately 450 nm, the selected wavelength for a second of the light-emitting diodes is in a range from approximately 455 to approximately 505 nm, the selected wavelength for a third of the light-emitting diodes is in a range from approximately 555 to approximately 565 nm, and the selected wavelength for a fourth of the light-emitting diodes is in a range from approximately 610 to approximately 620 nm.

6. A method for providing white light for a general illumination system, comprising:
   specifying a predetermined chromaticity such that the predetermined chromaticity is proximate the locus of points in chromaticity space corresponding to blackbody sources; and
   selecting wavelengths for at least three light-emitting diodes for providing visible light having a maximized color rendition index at the predetermined chromaticity.

7. The method of claim 6 wherein the step of selecting comprises maximizing color rendition index using wavelength versus color temperature data.

8. The method of claim 6 wherein the step of selecting comprises selecting wavelengths for three light-emitting diodes such that the color rendition index for the system is at least approximately 80.

9. The method of claim 8 wherein the selected wavelength for a first of the three light-emitting diodes is in a range from approximately 530 to approximately 570 nm, the selected wavelength for a second of the three light-emitting diodes is in a range from approximately 455 to approximately 490 nm, and the selected wavelength for a third of the three light-emitting diodes is in a range from approximately 605 to approximately 630 nm.

10. The method of claim 6 wherein the step of selecting comprises selecting wavelengths for four light-emitting diodes such that the color rendition index for the system is at least approximately 80.

11. The method of claim 10 wherein the selected wavelength for a first of the light-emitting diodes is in a range from approximately 440 to approximately 450 nm, the selected wavelength for a second of the light-emitting diodes is in a range from approximately 455 to approximately 505 nm, the selected wavelength for a third of the light-emitting diodes is in a range from approximately 555 to approximately 565 nm, and the selected wavelength for a fourth of the light-emitting diodes is in a range from approximately 610 to approximately 620 nm.

* * * * *